(12) United States Patent
Sato

(10) Patent No.: US 10,699,910 B2
(45) Date of Patent: Jun. 30, 2020

(54) SUBSTRATE LIQUID TREATMENT APPARATUS, SUBSTRATE LIQUID TREATMENT METHOD AND STORAGE MEDIUM

(71) Applicant: Tokyo Electron Limited, Tokyo (JP)

(72) Inventor: Hideaki Sato, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 0 days.

(21) Appl. No.: 15/723,301

(22) Filed: Oct. 3, 2017

(65) Prior Publication Data

US 2018/0096855 A1 Apr. 5, 2018

(30) Foreign Application Priority Data

Oct. 4, 2016 (JP) .................................. 2016-196663

(51) Int. Cl.
*H01L 21/311* (2006.01)
*G05D 7/06* (2006.01)
*H01L 21/67* (2006.01)

(52) U.S. Cl.
CPC ...... *H01L 21/31111* (2013.01); *G05D 7/0623* (2013.01); *H01L 21/67075* (2013.01); *H01L 21/67086* (2013.01)

(58) Field of Classification Search
CPC ......... H01L 21/31111; H01L 21/67075; H01L 21/67086
USPC .................................................. 438/745, 757
See application file for complete search history.

(56) References Cited

U.S. PATENT DOCUMENTS

| 6,001,215 A | 12/1999 | Ban |
| 9,881,799 B2 | 1/2018 | Sato et al. |
| 2002/0001967 A1 | 1/2002 | Yokomizo et al. |
| 2002/0102851 A1 | 8/2002 | Yokomizo et al. |
| 2007/0175387 A1* | 8/2007 | Kimura ............ H01L 21/67057 118/429 |

(Continued)

FOREIGN PATENT DOCUMENTS

| JP | 09-275091 A1 | 10/1997 |
| JP | 2000-058500 A | 2/2000 |

(Continued)

OTHER PUBLICATIONS

Japanese Office Action (with English translation), Japanese Application No. 2016-196663 dated May 15, 2020 (9 pages).

*Primary Examiner* — Binh X Tran
(74) *Attorney, Agent, or Firm* — Burr & Brown, PLLC

(57) ABSTRACT

A substrate liquid treatment method in one embodiment includes, storing a phosphoric acid solution in a processing bath provided in a liquid treatment unit, and immersing a substrate into the stored phosphoric acid solution to process the substrate, draining a phosphoric acid solution at a first drainage flow rate from the liquid treatment unit, and supplying a phosphoric acid solution to the liquid treatment unit, in a first time period in which the substrate is immersed in the phosphoric acid solution in the processing bath, and draining a phosphoric acid solution at a second drainage flow rate different from the first drainage flow rate, from the liquid treatment unit, and supplying a phosphoric acid solution to the liquid treatment unit, in a second time period in which the substrate is immersed in the phosphoric acid solution in the processing bath.

12 Claims, 5 Drawing Sheets

(56) References Cited

U.S. PATENT DOCUMENTS

2008/0305564 A1* 12/2008 Okuchi ............ H01L 21/67086
438/8
2016/0233106 A1 8/2016 Furukawa et al.

FOREIGN PATENT DOCUMENTS

| | | |
|---|---|---|
| JP | 2001-023952 A1 | 1/2001 |
| JP | 2015-070080 A1 | 4/2015 |
| JP | 2016-143684 A | 8/2016 |

* cited by examiner

SUBSTRATE LIQUID TREATMENT APPARATUS, SUBSTRATE LIQUID TREATMENT METHOD AND STORAGE MEDIUM

CROSS REFERENCE TO RELATED APPLICATIONS

This application is based upon and claims the benefit of priority from Japanese Patent Application No. 2016-196663, filed on Oct. 4, 2016, the entire contents of which are incorporated herein by reference.

FIELD OF THE INVENTION

The present invention relates to a substrate liquid treatment apparatus and a substrate liquid treatment method that each process a substrate with the use of a processing liquid, and also relates to a storage medium.

BACKGROUND ART

Process steps for manufacturing a semiconductor device includes a silicon nitride film etching step that immerses substrates (e.g., semiconductor wafers) in a phosphoric acid solution stored in a processing bath so that silicon nitrides films formed on the surfaces of the substrates are subjected to wet etching.

During etching, silicon derived from the silicon nitride film dissolves in the phosphoric acid solution. For the purpose of increasing the etch selectivity of the silicon nitride film to the silicon oxide film (i.e., the ratio of the silicon nitride etch rate to the silicon nitride etch rate), and of reducing particles derived from the dissolved silicon, etc., it is necessary to maintain the dissolved silicon concentration in the phosphoric acid solution within a predetermined range.

In JP2015-070080A (Patent Document 1), when substrates are being immersed in a phosphoric acid solution in a processing bath, the phosphoric acid solution in the processing bath is continuously drained at a predetermined constant drainage flow rate, while a phosphoric acid solution free of silicon (or phosphoric acid of low silicon concentration) is supplied into the processing bath at a constant flow rate which is the same as the drainage flow rate, whereby the silicon concentration in the phosphoric acid solution in the processing bath gradually increases when the substrates are being immersed in the phosphoric acid solution in the processing bath.

JPH09-275091A (Patent Document 2) describes a substrate processing apparatus including a silicon injection apparatus that injects silicon, e.g., colloidal silicon into a circulation line connected to a processing bath. The apparatus is configured to control the silicon concentration in the phosphoric acid solution within a desired range by injecting an amount of silicon, with the use of the silicon injection apparatus, which is determined based on the silicon concentration in the phosphoric acid solution detected by a silicon concentration sensor. Patent Document 2 describes that, in addition to the above, the apparatus is further provided with a drain for draining the phosphoric acid solution, which is being used, from the circulation line, and a phosphorous acid solution adding tube for adding a new phosphoric acid solution to the circulation line. Due to the injection of silicon, the drainage of the phosphoric acid solution which is being used and the addition of the new phosphoric acid solution, the silicon concentration in the phosphoric acid solution can be maintained within a desired range. Patent Document 2 does not describe that the amount of silicon contained in the phosphoric acid solution is changed among two or more different target values during the processing of substrates of one process lot.

JP2001-023952A (Patent Document 3) describes that, when silicon concentration in a phosphoric acid solution in a processing bath, which is detected by a concentration detection sensor, reaches a predetermined threshold value, a part of the phosphoric acid solution in the processing bath is drained and a new phosphoric acid solution is added to the processing bath during the interval between processing of substrates of a certain process lot and processing of substrates of the next lot, so as to maintain the silicon concentration in the phosphoric acid solution in the processing bath within a predetermined range. Patent Document 3 does not describe that, during the processing of substrates of one process lot, the phosphoric acid solution which is being used is drained from the processing bath and a new phosphoric acid solution is added thereto.

The technique of Patent Documents 1 to 3 cannot perform an etching process at different controlled etching rates, during the processing of substrates of one process lot.

SUMMARY OF THE INVENTION

The object of the present invention is to provide a technique that can change the etch selectivity when a substrate is being subjected to a liquid treatment.

According to one embodiment of the present invention, there is provided a substrate liquid treatment apparatus including: a liquid treatment unit including a processing bath configured to store a phosphoric acid solution to process a substrate immersed in the phosphoric acid solution stored in the processing bath; a phosphoric acid solution supplying unit configured to supply the phosphoric acid solution to the liquid treatment unit at a controlled flow rate; a phosphoric acid solution draining unit configured to drain the phosphoric acid solution in the liquid treatment unit at a controlled flow rate; and a control unit configured to control operations of the phosphoric acid solution supplying unit and the phosphoric acid solution draining unit, wherein: the control unit is configured to control the phosphoric acid solution draining unit to drain the phosphoric acid solution at a first drainage flow rate from the liquid treatment unit, and configured to control the phosphoric acid solution supplying unit to supply the phosphoric acid solution to the liquid treatment unit, in a first time period in which the substrate is immersed in the phosphoric acid solution in the processing bath; and the control unit is configured to control the phosphoric acid solution draining unit to drain the phosphoric acid solution at a second drainage flow rate different from the first drainage flow rate, from the liquid treatment unit, and configured to control the phosphoric acid solution supplying unit to supply the phosphoric acid solution to the liquid treatment unit, in a second time period in which the substrate is immersed in the phosphoric acid solution in the processing bath.

According to another embodiment of the present invention, there is provided a substrate liquid treatment method including: storing a phosphoric acid solution in a processing bath provided in a liquid treatment unit, and immersing a substrate into the stored phosphoric acid solution to process the substrate; draining the phosphoric acid solution at a first drainage flow rate from the liquid treatment unit, and supplying the phosphoric acid solution to the liquid treatment unit, in a first time period in which the substrate is immersed in the phosphoric acid solution in the processing bath; and draining the phosphoric acid solution at a second drainage flow rate different from the first drainage flow rate, from the liquid treatment unit, and supplying the phosphoric acid solution to the liquid treatment unit, in a second time period in which the substrate is immersed in the phosphoric acid solution in the processing bath.

According to yet another embodiment of the present invention, there is provided a storage medium storing a program, wherein upon execution of the program by a computer for controlling an operation of a substrate liquid treatment apparatus, the computer controls the substrate liquid treatment apparatus to perform the aforementioned substrate liquid treatment method.

According to the aforementioned embodiments, etching can be performed while achieving optimum etch selectivity in response to the progress of the etching, by changing the silicon concentration of the phosphoric acid solution when the liquid treatment of the substrates is being performed.

DESCRIPTION OF EMBODIMENTS

Embodiments of the present invention will be described herebelow with reference to the attached drawings. The specification firstly describes the overall configuration of a substrate liquid treatment system 1A in which a substrate liquid treatment apparatus 1 in one embodiment of the present invention is incorporated.

Figure 1:
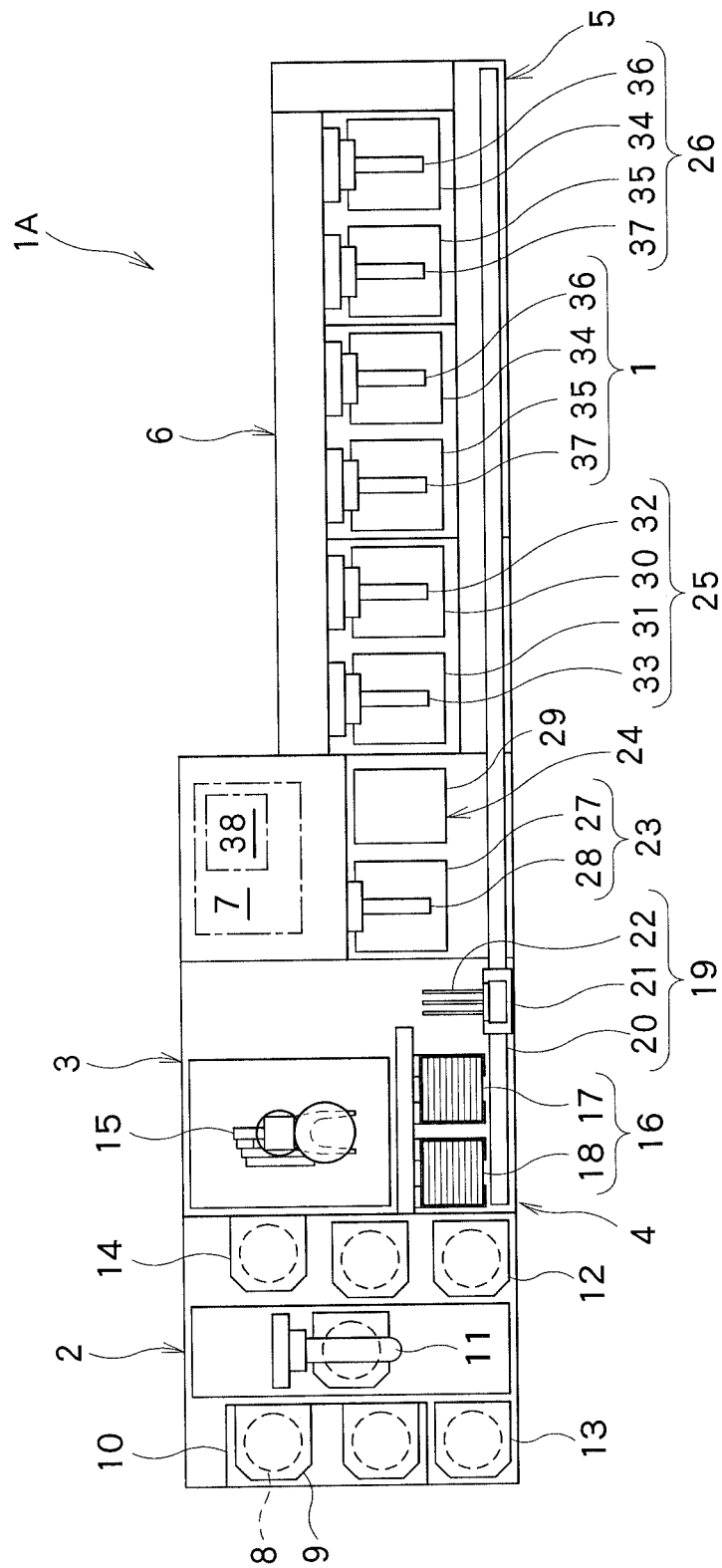
FIG. 1 is a schematic plan view showing the overall configuration of a substrate liquid treatment system.

As shown in FIG. 1, the substrate liquid treatment system 1A has a carrier in/out section 2, a lot forming section 3, a lot rack section 4, a lot conveyer section 5, a lot processing section 6 and a control section 7.

The carrier in/out section 2 performs carrying-in/out of a carrier 9 containing a plurality of (e.g., twenty five) substrates (e.g., silicon wafers) 8 which are arrayed in the vertical direction in a horizontal posture.

The carrier in/out section 2 is provided with a carrier stage 10 configured to allow a plurality of carriers 9 to be placed thereon, a carrier transfer mechanism 11 that transfers a carrier 9, carrier stocks 12 and 13 each configured to allow a carrier 9 to be temporarily stored thereon, and a carrier stage 14 configured to allow a carrier 9 to be placed thereon. The carrier stock 12 temporarily stores the carrier 9 containing the substrates 8 (product substrates), before the substrates 8 are processed in the lot processing section 6. The carrier stock 13 temporarily stores the carrier 9 containing the substrates 8 (product substrates), after the substrates 8 are processed in the lot processing section 6.

The carrier in/out section 2 transfers the carrier 9, which has been carried into the carrier stage 10 from the outside of the substrate liquid treatment system 1A, to the carrier stock 12 or the carrier stage 14 by using the carrier transfer mechanism 11. In addition, the carrier carry-in/out unit 2 transfers the carrier 9, which is placed on the carrier stage 14, to the carrier stock 13 or the carrier stage 10 by using the carrier transfer mechanism 11. The carrier 9, which has been transferred to the carrier stage 10, is transferred to the outside of the substrate liquid treatment system 1A.

The lot forming section 3 forms a lot consisting of a plurality of (e.g., fifty) substrates 8 to be simultaneously processed, by combining the substrates 8 accommodated in one or more carrier(s) 9. The lot may be formed such that the patterned surfaces of the substrates 8 are opposed to each other, or such that all the patterned surfaces of the substrates 8 are oriented in the same direction.

The lot forming section 3 is provided with a substrate transfer mechanism 15 that transfers a plurality of substrates 8. In the course of the transferring of the substrates 8, the substrate transfer mechanism 15 can change the posture of the substrates 8 from the horizontal posture to the vertical posture and vice versa.

The lot forming section 3 transfers the substrates 8 from the carrier 9 placed on the carrier stage 14 to the lot rack section 4 using the substrate transfer mechanism 15, and places the substrates 8 on the lot rack section 4 to form a lot. The lot forming section 3 also transfers a lot placed on the lot rack section 4 to the carrier 9 placed on the carrier stage 14, by the substrate transfer mechanism 15. The substrate transfer mechanism 15 has two substrate support units each for supporting a plurality of substrates 8, one being an unprocessed substrate support unit for supporting substrates 8 before being processed (before being transferred by the lot conveyer section 5), the other being a processed substrate support unit for supporting substrates 8 after being processed (after being transferred by the lot conveyer section 5). Thus, transferring of particles or the like adhered to the unprocessed substrates 8 to the processed substrates 8 can be prevented.

In the lot rack section 4, a lot, which is to be or has been transferred between the lot forming section 3 and the lot processing section 6 by the lot conveyer section 5, is temporarily placed on lot racks 16 to be on standby.

The lot rack section 4 is provided with a lot rack 17 for carrying-in provided to allow a lot to be placed thereon before being processed (before being transferred by the lot conveyer section 5) and a lot rack 18 for carrying-out provided to allow a lot to be placed thereon after being processed (after being transferred by the lot conveyer section 5). On each of the lot racks 17 and 18, a plurality of substrates 8 of one lot are placed side by side in the back and forth direction in the vertical posture.

In the lot rack section 4, a lot formed in the lot forming section 3 is placed on the lot rack 17. The lot is then transferred to the lot processing section 6 by the lot conveyer section 5. Also in the lot rack section 4, a lot transferred from the lot processing section 6 by the lot conveyer section 5 is placed on the lot rack 18. The lot is then transferred to the lot forming section 3.

The lot conveyer section 5 transfers a lot between the lot rack section 4 and the lot processing section 6, and also transfers a lot within the lot processing section 6.

The lot conveyer section 5 is provided with a lot transfer mechanism 19 that transfers a lot. The lot transfer mechanism 19 is composed of a rail 20 arranged along the lot rack section 4 and the lot processing section 6, and a mobile body 21 that moves along the rail 20 while holding a plurality of substrates 8. The mobile body 21 is provided with a substrate holder 22 capable of being moved back and forth. The substrate holder 22 is configured to hold a plurality of substrates 8 while they are arrayed side by side in the back and forth direction in the vertical posture.

The lot conveyer section 5 receives a lot placed on the lot rack 17 by the substrate holder 22 of the lot transfer mechanism 19, and delivers the lot to the lot processing section 6. The lot conveyer section 5 also receives a lot having been processed in the lot processing section 6 by the substrate holder 22 of the lot transfer mechanism 19, and transfers the lot to the lot rack 18. Further, the lot conveyer section 5 transfers the lot within the lot processing section 6 by using the lot transfer mechanism 19.

The lot processing section 6 performs a process or a liquid treatment (e.g., an etching process, a cleaning process, a drying process, etc.) to a plurality of substrates 8 forming one lot (process lot), which are arranged side by side in the back and forth direction in the vertical posture.

In the lot processing section 6, there are arranged side by side a drying apparatus 23 that performs the drying of substrates 8, a substrate holder cleaning apparatus 24 that performs the cleaning of the substrate holder 22, a cleaning apparatus 25 that performs the cleaning of substrates 8, and two etching apparatuses (substrate liquid treatment apparatuses) 1 in one embodiment of the present invention, which is configured to perform the etching of substrates 8.

The drying apparatus 23 has a processing bath 27, and a substrate lifting mechanism 28 provided in the processing bath 27 so as to be vertically movable. The processing bath 27 is supplied with a drying gas (e.g., IPA (isopropyl alcohol) or the like). On the substrate lifting mechanism 28, a plurality of substrates 8 of one lot are held side by side in the back and forth direction in the vertical posture. The drying apparatus 23 receives a lot from the substrate holder 22 of the lot transfer mechanism 19 by the substrate lifting mechanism 28, and moves the lot up and down by the substrate lifting mechanism 28 such that substrates 8 are dried by means of the drying gas supplied to the processing bath 27. Then, the drying apparatus 23 transfers the lot from the substrate lifting mechanism 28 to the substrate holder 22 of the lot transfer mechanism 19.

The substrate holder cleaning apparatus 24 has a processing bath 29 into which a cleaning liquid and a drying gas can be supplied. The substrate holder cleaning apparatus 24 cleans the substrate holder 22, by supplying the cleaning liquid and then supplying the drying gas to the substrate holder 22 of the lot transfer mechanism 19.

The cleaning apparatus 25 includes a processing bath 30 for cleaning and a processing bath 31 for rinsing. The processing baths 30 and 31 are provided with vertically-movable substrate lifting mechanisms 32 and 33, respectively. A cleaning liquid (e.g., SC-1) is stored in the processing bath 30. A rinsing liquid (e.g., pure water) is stored in the processing bath 31.

The etching apparatus 1 includes a processing bath 34 for etching and a processing bath 35 for rinsing. The processing baths 34 and 35 are provided with vertically-movable substrate lifting mechanisms 36 and 37, respectively. An etching liquid (e.g., phosphoric acid solution) is stored in the processing bath 34. A rinsing liquid (e.g., pure water) is stored in the processing bath 35. As described above, the etching apparatus 1 is the substrate liquid treatment apparatus in one embodiment of the present invention.

The cleaning apparatus 25 and the etching apparatus 1 have the same structure. The description will be made to the etching apparatus (substrate liquid treatment apparatus) 1. The substrate lifting mechanisms 36 holds a plurality of substrates 8 of one lot with the substrates being arrayed side by side to be held in the back and forth direction in the vertical posture. In the etching apparatus 1, the substrate lifting mechanism 36 receives a lot from the substrate holder 22 of the lot transfer mechanism 19, and the substrate lifting mechanism 36 moves the lot up and down, so that the lot is immersed into the etching liquid in the processing bath 34 thereby to etch the substrates 8. Thereafter, the etching apparatus 1 delivers the lot from the substrate lifting mechanism 36 to the substrate holder 22 of the lot transfer mechanism 19. The substrate lifting mechanism 37 then receives the lot from the substrate holder 22 of the lot transfer mechanism 19, and the substrate lifting mechanism 37 moves the lot up and down, so that the lot is immersed in the rinsing liquid in the processing bath 35 thereby to rinse the substrates 8. Thereafter, the lot is delivered from the substrate lifting mechanism 37 to the substrate holder 22 of the lot transfer mechanism 19.

The control section 7 controls operations of the respective sections (the carrier carry-in/out section 2, the lot forming section 3, the lot rack section 4, the lot conveyer section 5 and the lot processing section 6 (notably, the etching apparatus 1)) of the substrate liquid treatment system 1A.

The control section 7 comprises, for example, a computer, and has a computer-readable storage medium 38. The storage medium 38 stores program that controls various processes performed in the substrate liquid treatment apparatus 1. The control section 7 controls the operations of the substrate liquid treatment apparatus 1 by reading out and executing the program stored in the storage medium 38. The program may be one that has been stored in the computer-readable storage medium 38, or may be one that has been installed to the storage medium 38 of the control section 7 from another storage medium. The computer-readable storage medium 38 may be, for example, a hard disc (HD), a flexible disc (FD), a compact disc (CD), a magneto optical disc (MO), or a memory card.

As described above, in the processing bath 34 of the etching apparatus 1, a liquid process (etching process) is performed to the substrates 8 by using, as a processing liquid (etching liquid), a solution (phosphoric acid solution) of a chemical (phosphoric acid) having a predetermined concentration.

Figure 2:
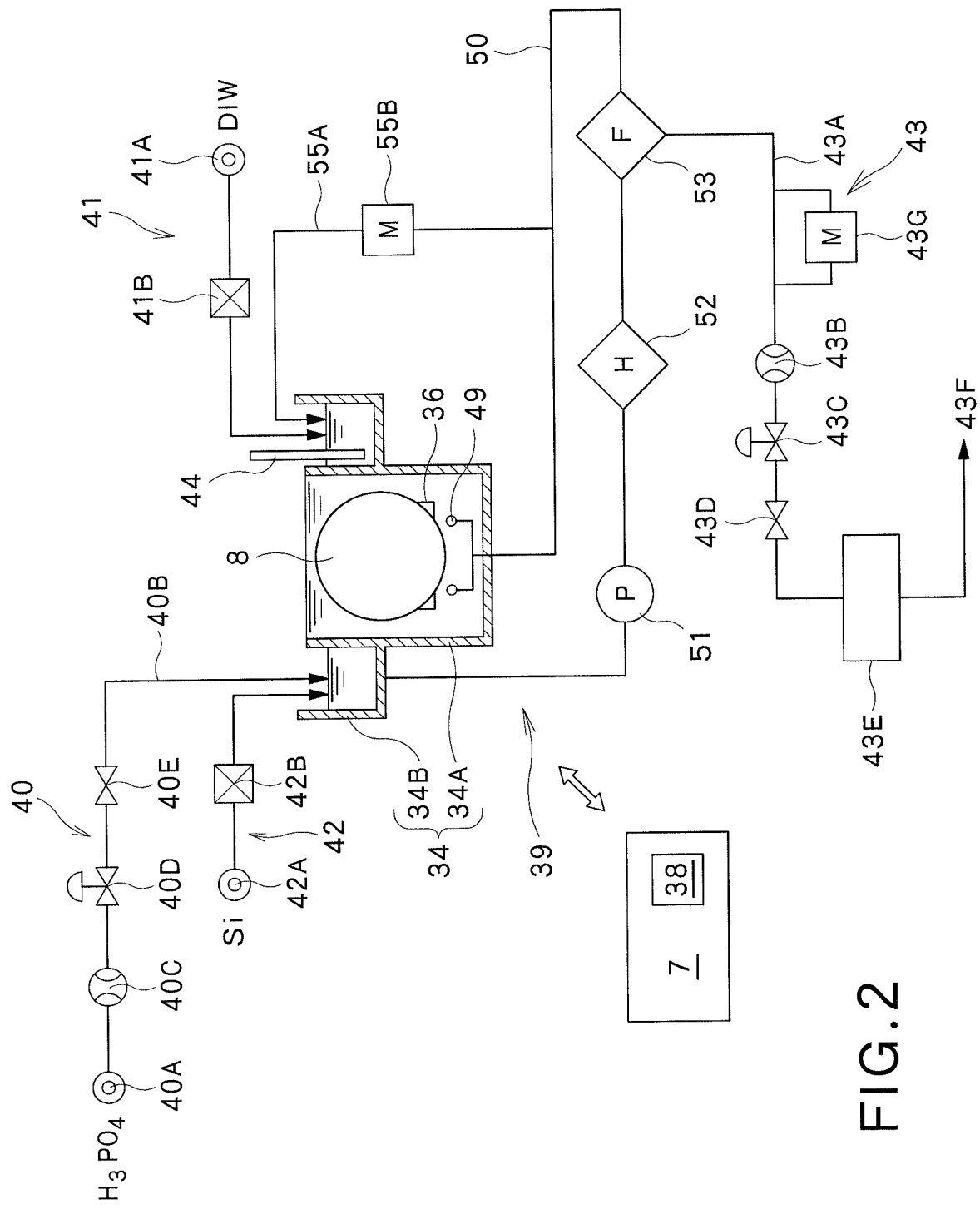
FIG. 2 is a diagram showing the structure of an etching apparatus incorporated in the substrate liquid treatment system.

Next, the structure of the etching apparatus (substrate liquid treatment apparatus) 1 is described with reference FIGS. 2 and 3.

The etching apparatus 1 has the aforementioned processing bath 34 that stores, as a processing liquid, a phosphoric acid solution having a predetermined concentration. The processing bath 34 has a top-opened inner bath 34A and a top-opened outer bath 34B disposed around the upper part of the inner bath 34A. A phosphoric acid solution overflowing from the inner bath 34A flows into the outer bath 34B.

One end of a circulation line 50 is connected to the bottom of the outer bath 34B. The other end of the circulation line 50 is connected to a processing liquid supplying nozzle 49 disposed in the inner bath 34A. The circulation line 50 is provided with a pump 51, a heater 52 and a filter 53 in this order from the upstream side. By driving the pump 51, a circulation flow of the phosphoric acid solution is formed, which flows from the outer bath 34B through the circulation line 50 and the processing liquid supplying nozzle 49 into the inner bath 34A, and then flows out therefrom into the outer bath 34B.

The processing bath 34, the circulation line 50 and the devices (51, 52, 53 and so on) in the circulation line 50 constitute a liquid treatment unit 39. The processing bath 34 and the circulation line 50 constitute a circulation system.

The processing bath 34 is provided with the aforementioned substrate lifting mechanism 36. The substrate lifting mechanism 36 can hold a plurality of substrates 8 with the substrates 8 being arrayed at horizontal intervals in vertical posture, and can move up and down under that condition.

The etching apparatus 1 includes a phosphoric acid solution supplying unit 40 that supplies the liquid treatment unit 39 with a phosphoric acid solution, a pure water supplying unit 41 that supplies the liquid treatment unit 39 with pure water, a silicon supplying unit 42 that supplies the liquid treatment unit 39 with a silicon solution, and a phosphoric acid solution draining unit 43 that drains the phosphoric acid solution from the liquid treatment unit 39.

The phosphoric acid solution supplying unit 40 supplies a phosphoric acid solution having a predetermined concentration into the circulation system formed of the processing bath 34 and the circulation line 50 (i.e., to any part in the liquid treatment unit 39), preferably to the outer bath 34B as illustrated. The phosphoric acid solution supplying unit 40 includes a phosphoric acid solution source 40A comprising a tank storing a phosphoric acid solution, a phosphoric acid solution supplying line 40B connecting the phosphoric acid solution source 40A and the outer bath 34B, and a flowmeter 40C, a flow rate regulating valve 40D and a shutoff valve 40E that are disposed on the phosphoric acid solution supplying line 40B in this order from the upstream side. The phosphoric acid solution supplying unit 40 can supply, to the outer bath 34B, a phosphoric acid solution at a controlled flow rate via the flowmeter 40C and the flow rate regulating valve 40D.

The pure water supplying unit 41 supplies pure water in order to replenish water that is lost by evaporation due to the heating of the phosphoric acid solution. The pure water supplying unit 41 includes a pure water source 41A that supplies pure water having a predetermined temperature. The pure water source 41A is connected to the outer bath 34B through a flow rate regulator 41B. The flow rate regulator 41B may be composed of a shutoff valve, a flow rate regulating valve, a flowmeter and so on.

The silicon supplying unit 42 has a silicon source 42A comprising a tank storing a silicon solution, for example, a liquid in which colloidal silicon is dispersed, and a flow rate regulator 42B. The flow rate regulator 42B may be composed of a shutoff valve, a flow rate regulating valve, a flowmeter and so on.

The phosphoric acid solution draining unit 43 is disposed for draining a phosphoric acid solution in the circulation system formed of the liquid treatment unit 39 and the circulation line 50, i.e., in the liquid treatment unit 39. The phosphoric acid solution draining unit 43 has a draining line 43A branched from the circulation line 50, and a flowmeter 43B, a flow rate regulating valve 43C, a shutoff valve 43D and a cooling tank 43E that are disposed on the draining line 43A in this order from the upstream side. The phosphoric acid solution draining unit 43 can drain a phosphoric acid solution at a controlled flow rate via the flowmeter 43B and the flow rate regulating valve 43C.

The cooling tank 43E temporarily stores a phosphoric acid solution flowing through the draining line 43A and cools the same. A phosphoric acid solution (see reference numeral 43F) flowing out from the cooling tank 43E may be discarded to a factory waste liquid system (not shown), or may be sent to the phosphoric acid solution source 40A for reuse after removing silicon contained in the phosphoric acid solution by a regeneration apparatus (not shown).

In the illustrated example, the draining line 43A is connected to the circulation line 50 (the filter drain position in the illustration). However, not limited thereto, the draining line 43A may be connected to another part in the circulation system, e.g., the bottom of the inner bath 34A.

The draining line 43A is provided with a silicon concentration meter 43G that measures the silicon concentration in the phosphoric acid solution. A branch line 55A is branched from the circulation line 50 to be connected to the outer bath 34B. The branch line 55A is provided with a phosphoric acid concentration meter 55B that measures the phosphoric acid concentration in the phosphoric acid solution. The outer bath 34B is provided with a level meter 44 that detects the liquid level in the outer bath 34B.

Figure 3:
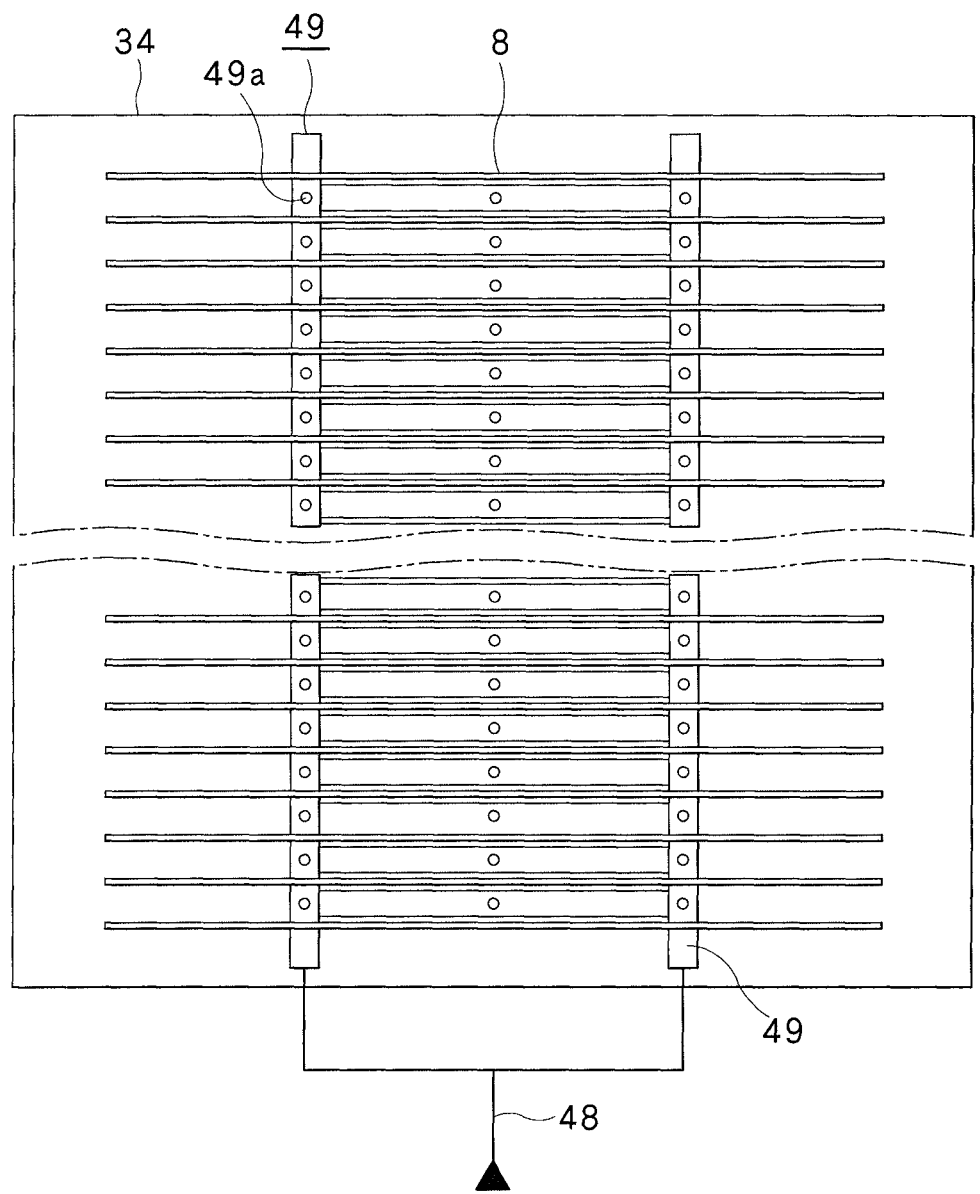
FIG. 3 is a plan view showing substrates held in a processing bath of the etching apparatus.

As shown in FIG. 3, the processing liquid supplying nozzle 49 is formed of a cylindrical body, which extends in the direction in which the substrates 8 are arrayed. The processing liquid supplying nozzle 49 discharges, from a plurality of discharge holes formed in its circumferential surface, the processing liquid toward the substrates 8 held by the substrate lifting mechanism 36.

The substrate liquid treatment apparatus 1 processes the substrates 8 by controlling operations of the respective sections (the carrier in/out section 2, the lot forming section 3, the lot rack section 4, the lot conveyer section 5, the lot processing section 6 (the etching apparatus 1)) by means of the control section 7 in accordance with a process recipe stored in the storage medium 38. The operative components (the shutoff valve, the flow rate regulating valve, the pump, the heater and so on) of the etching apparatus 1 are operated based on operation instruction signals transmitted from the control section 7. The signals indicating detection results are sent from the sensors (43G, 55B, 44 and so on) to the control section 7, and the control section 7 uses the detection results for controlling the operative components.

Next, an operation of the above etching apparatus 1, i.e., a substrate liquid treatment method is described. Firstly, the phosphoric acid solution supplying unit 40 supplies a phosphoric acid solution to the outer bath 34B of the liquid treatment unit 39. When a predetermined period of time has passed after the start of the supply of the phosphoric acid solution, the pump 51 of the circulation line 50 is activated, so that the aforementioned circulation flow circulating the circulation system is generated.

Further, the heater 52 of the circulation line 50 is activated such that the phosphoric acid solution in the inner bath 34A is heated up to a predetermined temperature (e.g., 160° C.). Since the phosphoric acid solution at 160° C. is boiling, water is evaporated therefrom so that a phosphoric acid concentration in the phosphoric acid solution increases as time passes by. When the phosphoric acid concentration measured by the phosphoric acid concentration meter 55B exceeds a predetermined management upper limit, pure water is supplied from the pure water supplying unit 41. The supply of pure water for adjusting the phosphoric acid concentration can be performed at any timing when the substrates 8 are being immersed in the processing liquid (i.e., during the liquid treatment of the substrates). The supply of pure water for adjusting the phosphoric acid concentration may be performed when the substrates 8 are not being immersed in the processing liquid.

The silicon concentration in the phosphoric acid solution affects the etch selectivity (etch selection ratio) of the silicon nitride film relative to the silicon oxide film, which are both formed on the substrate 8. In order to achieve a desirable etch selectivity, the initial silicon concentration is adjusted before the substrates 8 are immersed into the phosphoric acid solution in the inner bath 34A.

The adjustment of the initial silicon concentration can be performed by immersing, by the substrate lifting mechanism 36, a plurality of dummy silicon substrates into the phosphoric acid solution stored in the inner bath 34A. Such a process is referred to as seasoning. In place of this process, the adjustment of the initial silicon concentration may be performed by supplying a silicon solution to the outer bath 34B by the silicon supplying unit 42.

A preliminary test may be conducted to determine the seasoning condition which enables a desired initial silicon concentration. The seasoning may be performed in accordance with the determined condition. In the case where the silicon concentration is adjusted by supplying the silicon solution from the silicon supplying unit 42, a preliminary test may be conducted for determining the amount of silicon solution to be supplied, which enables the desired initial silicon concentration.

It is easy to achieve the desired initial silicon concentration by performing the seasoning or the supply of the silicon solution in accordance with the condition determined based on the preparatory test result. In order to confirm that the silicon concentration in the phosphoric acid solution present in the circulation system is within a predetermined range, the phosphoric acid solution may be supplied to the discharge line 43A to measure the silicon concentration by the silicon concentration meter 43G.

After the adjustment of the initial silicon concentration is completed, a plurality of substrates 8, e.g., fifty substrates 8 forming one lot (it is also referred to as "process lot" or "batch"), which are held by the substrate lifting mechanism 36, are immersed into the phosphoric acid solution having a predetermined concentration and a predetermined temperature stored in the inner bath 34A, so that the substrates 8 are etched (liquid-treated) by the phosphoric acid solution. At this time, bubbles generated due to boiling of water elevate in the phosphoric acid solution in the inner bath 34A, and the phosphoric acid solution circulates in the inner bath 34A because of the elevating bubbles, whereby the etching process by the phosphoric acid solution is promoted.

During the processing of the substrates 8, since the silicon nitride film on the substrate 8 is etched, the silicon derived from the silicon nitride film dissolves in the phosphoric acid solution. Thus, the silicon concentration in the phosphoric acid solution gradually rises as time passes by. Excessively high silicon concentration would result in problems such as deterioration of particle level, clogging of filter and so on. In some cases, a silicon oxide film should be etched to some degree. In such cases, excessively high silicon concentration would result in the situation where the silicon oxide film cannot be etched to the desired degree. In any case, the silicon concentration should be maintained within a range by which a desired process result can be achieved.

To this end, after the immersion of the substrates 8, while the phosphoric acid solution (which contains relatively a larger amount of silicon) present in the liquid treatment unit (constituted by the processing bath 34, the circulation line 50 and the devices (51, 52, 53, etc.) in the circulation line 50), i.e., in the circulation system, is drained at a first drainage flow rate by the phosphoric acid solution draining unit 43, a phosphoric acid solution free of silicon or a phosphoric acid solution containing only a slight amount of silicon (referred to as "low Si phosphoric acid solution" for simplicity herebelow) is supplied at a first supply flow rate by the phosphoric acid solution supplying unit 40.

The low Si phosphoric acid solution supplied from the phosphoric acid solution supplying unit 40 may be a new (unused) phosphoric acid solution free of silicon, or may be a recycled phosphoric acid solution (which may contain a slight amount of silicon) from which impurities such as silicon are removed after use.

The total amount of the phosphoric acid solution in the liquid treatment unit 39, in other words, the total amount of the phosphoric acid solution in the circulation system comprising the processing bath 34 and the circulation line 50 is maintained substantially constant. Thus, the first drainage flow rate and the first supply flow rate are substantially the same. However, as an exception, when pure water is being supplied from the pure water supplying unit 41 for adjusting the phosphoric acid concentration, the supply flow rate of the phosphoric acid solution supplied from the phosphoric acid solution supplying unit 40 may be decreased by an amount corresponding to an amount of pure water which is being supplied.

By changing the first drainage flow rate and the first supply flow rate, the degree of inhibition of the rise in silicon concentration in the phosphoric acid solution, which rise is caused by dissolution of the silicon nitride film, can be changed.

By setting the first drainage flow rate and the first supply flow rate high, the silicon concentration rising rate can be reduced. By setting the first drainage flow rate and the first supply flow rate higher, the silicon concentration rising rate can be controlled to a negative value. By setting the first drainage flow rate and the first supply flow rate low, the silicon concentration rising rate can be increased.

Based on the above principle, the following process conditions can be realized. In one example, the initial silicon concentration is set relatively high and the first drainage flow rate and the first supply flow rate are set relatively high, so that the etching of the substrate 8 of one process lot (meaning a set of, e.g., fifty substrates 8 forming a batch) is performed with the silicon concentration being maintained substantially constant, whereby the etch selectivity (etch selection ratio) is maintained substantially constant. In another example, the initial silicon concentration is set relatively low and the first drainage flow rate and the first supply flow rate are set relatively low, so that the etching of the substrates 8 of one process lot is performed with the silicon concentration gradually rising with time, whereby the etching selection ratio is gradually increased with time.

Figure 4:
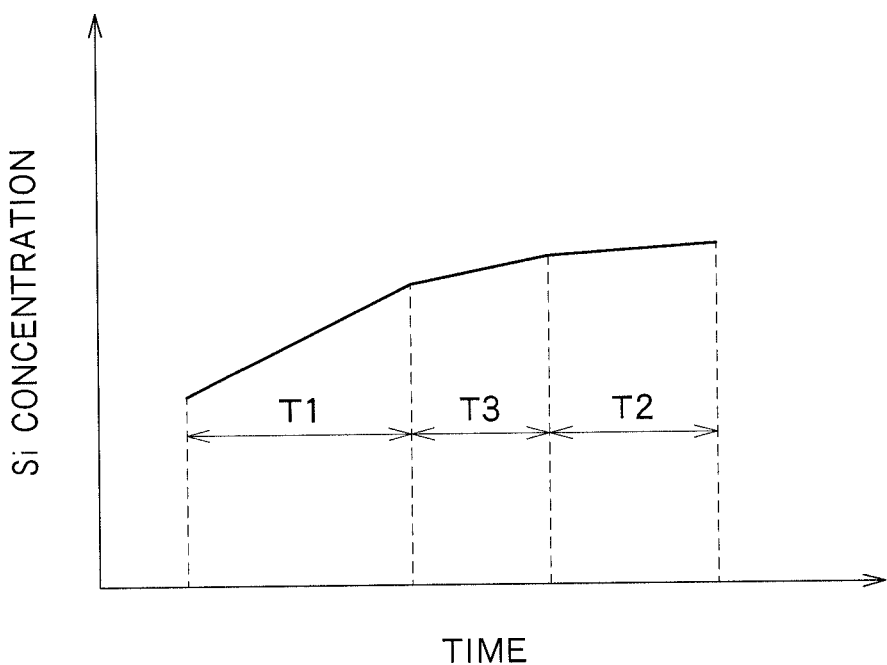
FIG. 4 is a graph showing an example of change of silicon concentration in a phosphoric acid solution, during processing of the substrates of one process lot.

As shown in FIG. 4, in order that the silicon concentration in a first time period T1 during the processing of the substrates 8 of one process lot is different from the silicon concentration in a second time period T2, the drainage flow rate and the supply flow rate in the first time period T1 may be set as the aforementioned first drainage flow rate and the first supply flow rate, and the drainage flow rate and the supply flow rate in the second time period T2 may be set as a second drainage flow rate and a second supply flow rate that are different from the first drainage flow rate and the first supply flow rate. Further, a third time period T3 may be provided between the first time period T1 and the second time period T2, and the drainage flow rate and the supply flow rate in the third time period T3 may be set as a third drainage flow rate and a third supply flow rate. According to the above operation, the etch selectivity can be changed depending on the degree of the etching progress.

In a preferred embodiment, the drainage flow rate of the phosphoric acid solution by the phosphoric acid solution draining unit 43 and the supply flow rate of the phosphoric acid solution from the phosphoric acid solution supplying unit 40 in each of the time periods (T1, T2) are determined beforehand as constant values (constant values unchanged through one time period) based on the results of a preliminary test. These constant values are stored in the storage medium 38 as target values constituting a part of a process recipe. The control section 7 controls the phosphoric acid solution draining unit 43 and the phosphoric acid solution supplying unit 40 such that the drainage flow rate and the supply flow rate correspond to the values specified in the process recipe. Thus, the silicon concentration in the phosphoric acid solution in the circulation system in each time period can be maintained within a desired range. In this case, whether the silicon concentration is maintained within an allowable range about the target value can be confirmed (monitored) by using the silicon concentration meter 43G disposed on the phosphoric acid solution draining unit 43.

If rapid rise of the silicon concentration is needed at the transition from a certain time period to the next time period, the silicon solution may be added by the silicon supplying unit 42 to the phosphoric acid solution in the circulation system.

After processing of the substrates 8 of one lot is completed, the substrates 8 are carried out from the processing bath 34. Then, before substrates 8 of the next lot are put into the processing bath 34, the phosphoric acid solution is drained from the phosphoric acid solution draining unit 43 and the phosphoric acid solution is supplied from the phosphoric acid solution supplying unit 40, and silicon solution is supplied from the silicon supplying unit 42 may be supplied in some case, in order to achieve an initial silicon concentration suited for processing of the substrates of the next process lot.

A preferred example of the operation in which the drainage flow rate and the supply flow rate are changed for each time period during processing of the substrates 8 of one lot, as described above, is described below.

Figure 5:
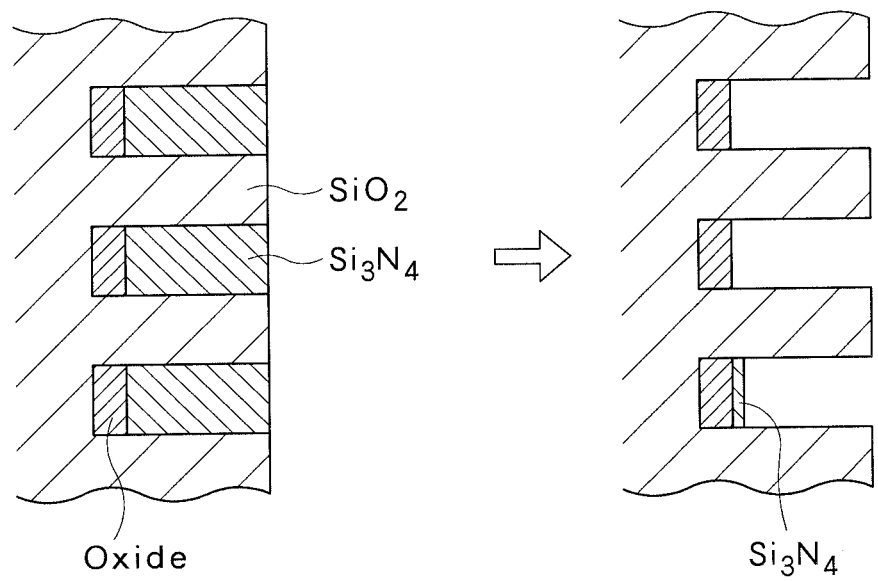
FIG. 5 is a schematic sectional view showing the structure of the substrate to be processed by the etching apparatus.

As schematically shown in FIG. 5, in the substrate 8 having a multi-layered structure (three dimensional lamination structure), there is a process in which silicon nitride layers (SiN) are completely removed so as to completely expose the underlying oxide layers (Oxide). In this case, because of dispersion in etching progress of the respective silicon nitride layers, there is a possibility that all the silicon nitride layers are not completely removed so that the silicon nitride layer slightly remains as shown in the bottom of the right column in FIG. 5. The dispersion in etching progress may be caused, for example, by dispersion in film quality of the respective silicon nitride layers, although the dispersion is within an allowable range.

In order to completely eliminate the possibility inviting such a circumstance, a safety margin is set in a process time, in statistical consideration of dispersion in time required for etching. That is, the process time is set longer than a time generally required for completely removing all the silicon nitride layers.

Figure 6:
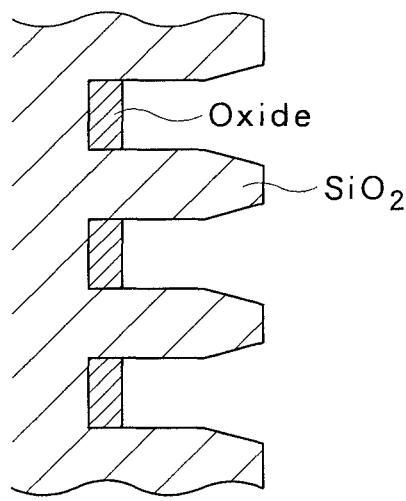
FIG. 6 is a schematic sectional view showing the structure of the substrate having been processed by the etching apparatus.

After all the silicon nitride layers are completely removed, silicon derived from the silicon nitride layer no longer dissolves in the phosphoric acid solution. In addition, when almost all of the silicon nitride layers are completely removed but only a part of a silicon nitride layer remains, dissolution of silicon rarely occurs. Under such a situation, if the draining of the phosphoric acid solution through the phosphoric acid solution draining unit 43 is continued at the previous drainage flow rate and the supply of a phosphoric acid solution from the phosphoric acid solution supplying unit 40 is continued at the previous supply flow rate, the silicon concentration in the phosphoric acid solution in the inner bath 34A gradually lowers. If the silicon concentration lowers, the etch rate of the silicon oxide layer (SiO$_2$) rises. Thus, as shown in FIG. 6 for example, corners of the silicon oxide layer may be etched more than expected.

Figure 7:
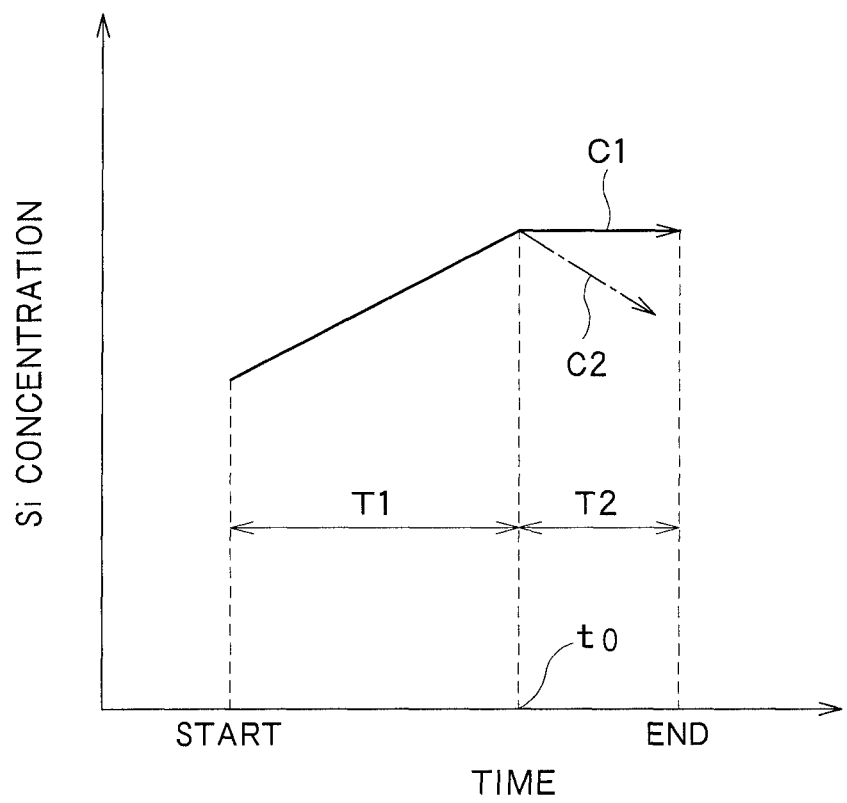
FIG. 7 is a graph showing another example of change of silicon concentration in a phosphoric acid solution, during processing of substrates of one process lot.

In order to avoid such a situation, at time point t0 (see FIG. 7) (a time point prior to a process end point of time by a time corresponding to the aforementioned safety margin) at which all the silicon nitride layers are estimated to be completely removed, the draining of the phosphoric acid solution through the phosphoric acid solution draining unit 43 may be stopped (the drainage flow rate is made zero), and the supply of the phosphoric acid solution from the phosphoric acid solution supplying unit 40 may be stopped (the supply flow rate is made zero). Assuming that a time period prior to the time point at which all the silicon nitride layers are estimated to be completely removed is the first time period T1, and that a time period posterior to that time point is the second time period T2 (this is the final time period in the process), the drainage flow rate and the supply flow rate of the phosphoric acid solution in the first time period are set as a first drainage flow rate and a first supply flow rate, and the drainage flow rate and the supply flow rate of the phosphoric acid solution in the second time period are set as a second drainage flow rate and a second supply flow rate (both may be zero in this example) that are smaller than the first drainage flow rate and the first supply flow rate. Thus, after all the silicon nitride layers are practically removed, undesirable lowering of the silicon concentration as shown by the arrow C2 in FIG. 7 does not occur, but the silicon concentration is maintained substantially constant as shown by the arrow C1 in FIG. 7.

Even if only a slight part of the silicon nitride layer remains at a time point when the drainage of the phosphoric acid solution and the supply of the phosphoric acid solution are stopped, only a slight increase of silicon concentration is caused by dissolution of the remaining silicon nitride layer, which does not affect the processing result.

Instead of setting both of the second drainage flow rate and the second supply flow rate in the second time period T2 zero as mentioned above, they may be set to small values that are not zero.

If etching of the corners of the silicon oxide layers as shown in FIG. 6 is intended, the second drainage flow rate and the second supply flow rate may be larger than the first drainage flow rate and the first supply flow rate. Alternatively, a third time period T3 may be provided between the first time period T1 and the second time period T2, and a third drainage flow rate and a third supply flow rate in the third time period T3 may be larger than the first drainage flow rate and the first supply flow rate. Yet alternatively, a third time period T3 may be provided after the second time period T2, and a third drainage flow rate and a third supply flow rate in the third time period T3 may be larger than the first drainage flow rate and the first supply flow rate.

According to the aforementioned embodiments, etching can be performed while achieving optimum etch selectivity in response to the progress of the etching, by changing the silicon concentration of the phosphoric acid solution at least once when the liquid treatment of the substrates 8 of one lot is being performed.

In the aforementioned embodiments, the drainage flow rate of the phosphoric acid solution by the phosphoric acid solution draining unit 43 and the supply flow rate of the phosphoric acid solution by the phosphoric acid solution supplying unit 40 are controlled such that they correspond to predetermined values. However, a modification is possible.

For example, the target silicon concentration in each time period may be specified in the process recipe. In this case, in order to achieve each target silicon concentration, the drainage flow rate of the phosphoric acid solution by the phosphoric acid solution draining unit 43 and the supply flow rate of the phosphoric acid solution by the phosphoric acid solution supplying unit 40 are feedback-controlled based on the detection value of the silicon concentration meter 43G.

What is claimed is:

1. A substrate liquid treatment apparatus comprising:
    a liquid treatment unit including a processing bath configured to store a phosphoric acid solution to process a substrate immersed in the phosphoric acid solution stored in the processing bath;
    a phosphoric acid solution supplying unit configured to supply the phosphoric acid solution to the liquid treatment unit at a controlled flow rate;
    a phosphoric acid solution draining unit configured to drain the phosphoric acid solution in the liquid treatment unit at a controlled flow rate;
    a silicon concentration meter configured to measure silicon concentration in the phosphoric acid solution; and
    a control unit configured to control operation of the substrate liquid treatment apparatus based on a predetermined process recipe, and the control unit is configured to control operations of the phosphoric acid solution supplying unit and the phosphoric acid solution draining unit,
    wherein:
    the control unit is configured to control the phosphoric acid solution draining unit to drain the phosphoric acid solution at a first drainage flow rate from the liquid treatment unit, and configured to control the phosphoric acid solution supplying unit to supply the phosphoric acid solution to the liquid treatment unit, in a first time period, so that the substrate is immersed in the phosphoric acid solution having a first target silicon concentration in the processing bath, with the process recipe specifying the first target silicon concentration to be achieved in the first time period;
    the control unit is configured to control the phosphoric acid solution draining unit to drain the phosphoric acid solution at a second drainage flow rate different from the first drainage flow rate, from the liquid treatment unit, and configured to control the phosphoric acid solution supplying unit to supply the phosphoric acid solution to the liquid treatment unit, in a second time period, which is immediately after the first time period, so that the same substrate is immersed in the phosphoric acid solution having a second target silicon concentration in the same processing bath, with the process recipe specifying the second target silicon concentration to be achieved in the second time period; and
    the control unit is configured to control the phosphoric acid solution draining unit in a feedback manner based on a measured silicon concentration measured by the silicon concentration meter such that the first and second target silicon concentrations are achieved in the first and second time periods, respectively.

2. The substrate liquid treatment apparatus according to claim 1, wherein:
    the liquid treatment unit includes the processing bath, and a circulation line through which a phosphoric acid solution flowing out from the processing bath is returned to the processing bath;
    the phosphoric acid solution supplying unit is configured to supply the phosphoric acid solution to the processing bath; and
    the phosphoric acid solution draining unit is configured to drain the phosphoric acid solution from the circulation line.

3. The substrate liquid treatment apparatus according to claim 1, wherein the process recipe defines the first drainage rate and the second drainage rate as previously-determined target values, and wherein the control unit is configured to control the phosphoric acid solution draining unit such that the first drainage rate and the second drainage rate defined by the process recipe are achieved.

4. The substrate liquid treatment apparatus according to claim 1, wherein the second time period is a final time period among time periods in which the substrate is immersed in the phosphoric acid solution in the processing bath.

5. The substrate liquid treatment apparatus according to claim 4, wherein the second drainage flow rate is zero.

6. The substrate liquid treatment apparatus according to claim 4, wherein the control unit is configured to control the phosphoric acid solution draining unit to drain the phosphoric acid solution at a third drainage flow rate from the liquid treatment unit, and configured to control the phosphoric acid solution supplying unit to supply a phosphoric acid solution to the liquid treatment unit, in a third time period before the first time period and the second time period in which the substrate is immersed in the phosphoric acid solution in the processing bath.

7. A substrate liquid treatment method performed by the substrate liquid treatment apparatus according to claim 1, the method comprising:
    storing the phosphoric acid solution the processing bath provided in the liquid treatment unit, and immersing the substrate into the stored phosphoric acid solution to process the substrate;
    draining the phosphoric acid solution at the first drainage flow rate from the liquid treatment unit, and supplying the phosphoric acid solution to the liquid treatment unit, in the first time period, so that the substrate is immersed in the phosphoric acid solution having the first target silicon concentration in the processing bath, with a the process recipe specifying the first target silicon concentration to be achieved in the first time period;
    draining the phosphoric acid solution at the second drainage flow rate different from the first drainage flow rate, from the liquid treatment unit, and supplying the phosphoric acid solution to the liquid treatment unit, in the second time period, which is immediately after the first time period, so that the same substrate is immersed in the phosphoric acid solution having the second target silicon concentration in the same processing bath, with the process recipe specifying the second target silicon concentration to be achieved in the second time period; and
    measuring the silicon concentration in the phosphoric acid solution and draining the phosphoric acid solution, from the liquid treatment unit, in the feedback manner based on the measured silicon concentration such that the first and second target silicon concentrations are achieved in the first and second time periods, respectively.

8. The substrate liquid treatment method according to claim 7, wherein:
the second time period is a final time period among time periods in which the substrate is immersed in the phosphoric acid solution in the processing bath.

9. The substrate liquid treatment method according to claim 8, wherein the second drainage flow rate is zero.

10. The substrate liquid treatment method according to claim 8, wherein the substrate includes a silicon oxide layer and a silicon nitride layer, an end point of time of the first time period is a time point at which all the silicon nitride layer to be etched is estimated to be removed; and an end point of time of the second time period is a time point at which all the silicon nitride layer is certainly removed even in consideration of dispersion in etching progress of the silicon nitride layer.

11. The substrate liquid treatment method according to claim 8, further comprising draining the phosphoric acid solution from the liquid treatment unit at a third drainage flow rate and supplying a phosphoric acid solution to the liquid treatment unit, in a third time period before the first time period and the second time period in which the substrate is immersed in the phosphoric acid solution in the processing bath.

12. A non-transitory storage medium storing a program, wherein upon execution of the program by a computer for controlling an operation of a substrate liquid treatment apparatus, the computer controls the substrate liquid treatment apparatus to perform the substrate liquid treatment method according to claim 7.

* * * * *